United States Patent
Gosselin et al.

(10) Patent No.: US 7,037,819 B2
(45) Date of Patent: May 2, 2006

(54) METHOD OF MAKING A CIRCUITIZED SUBSTRATE

(75) Inventors: Timothy A. Gosselin, Apalachin, NY (US); Donald I. Mead, Montrose, PA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/967,035

(22) Filed: Oct. 15, 2004

(65) Prior Publication Data

US 2005/0048748 A1  Mar. 3, 2005

Related U.S. Application Data

(62) Division of application No. 10/205,136, filed on Jul. 25, 2002, now Pat. No. 6,818,988.

(51) Int. Cl.
*H01L 21/44* (2006.01)

(52) U.S. Cl. .............. 438/612; 438/613; 257/737; 257/738; 257/779; 257/780

(58) Field of Classification Search ........ 438/612–613; 257/737–738, 779–780
See application file for complete search history.

(56) References Cited

U.S. PATENT DOCUMENTS

| | | | |
|---|---|---|---|
| 5,255,839 A | 10/1993 | da Costa Alves et al. | 228/180.21 |
| 6,056,189 A | 5/2000 | Gao et al. | 228/207 |
| 6,573,458 B1 * | 6/2003 | Matsubara et al. | 174/260 |
| 6,740,577 B1 * | 5/2004 | Jin et al. | 438/612 |

FOREIGN PATENT DOCUMENTS

JP    JP 0017179    2/1981

OTHER PUBLICATIONS

EEP-vol. 26-2, Advances in Electronic Packaging—1999, "Selection of a No-Clean Flux for Flip Chip Applications", J. D. Poole et al., Solectron Corporation, Charlotte, N.C., pp. 1355-1362.

* cited by examiner

*Primary Examiner*—Luan Thai
(74) *Attorney, Agent, or Firm*—William N. Hogg

(57) ABSTRACT

A circuitized substrate and a method of making the circuitized substrate are provided. The circuitized substrate includes a substrate having a conductive pad thereon. A first layer of solder enhancing material is positioned on the conductive pad, the first layer of solder enhancing material includes a first region and a second region positioned relative to the first region. A solder member is positioned on the first region of the first layer of solder enhancing material. A second layer of solder enhancing material is positioned on the solder member and on a portion of the second region of the first layer of solder enhancing material. The circuitized substrate may be used in the fabrication of an electronic package.

14 Claims, 3 Drawing Sheets

METHOD OF MAKING A CIRCUITIZED SUBSTRATE

CROSS REFERENCE TO RELATED APPLICATIONS

This application is a divisional of application Ser. No. 10/205,136, filed Jul. 25, 2002 now U.S. Pat. No. 6,818,988.

FIELD OF THE INVENTION

This invention relates generally to electronic packaging, and more particularly to a method for mounting a solder member on a conductive pad of a substrate to make a circuitized substrate.

BACKGROUND OF THE INVENTION

The use of tin-lead based solders for electronic packaging is well established. Market and legislative pressures are accelerating the reduction, and perhaps elimination, of lead from solders used in electronics packaging. Unfortunately, lead-free alloys typically have poorer wetting characteristics than lead based solder alloys.

Tin-lead solder is widely used in the electronics industry for electrical and mechanical interconnections between devices and chip carriers and between chip carriers and printed wiring boards. The interconnection between a chip carrier and a printed wiring board often involves a ball grid array (BGA) interconnection.

The manufacture of a BGA interconnection on a chip carrier usually involves the attachment of solder members, for example, spheres, to conductive (and solderable) pads on the chip carrier. Solder paste is another method used to form the BGA interconnection. Regardless of the process used, a solder enhancing material such as a solder flux is usually used to enhance solderability. Solder flux serves two important functions. First, it provides an adhesive property that maintains solder members in position after they are positioned on conductive pads until a mechanical interconnection is made by soldering. Flux also functions to remove oxides from the metallic surfaces of both the solder members and conductive pads, promoting a robust metallurgical bond, during reflow and solidification, between solder members and conductive pads.

Solder fluxes used in the electronics industry vary depending on application method and whether the flux is water soluble or no-clean. A water soluble flux is a flux that leaves aqueous residue behind that can be cleaned with water after processing. A no-clean flux is a flux that leaves non-ionic residues behind that are typically left on the parts for further processing. Either type of flux can be sprayed, screened, or transferred by pins onto the conductive pads to be soldered. Sometimes solder members are dipped into flux and then positioned on conductive pads.

During the heat up and reflow process used to make the interconnection, flux chemically reacts with oxides on the surface of the solder members/conductive pads and oxygen in the reflow oven environment. Increasing the quantity of flux used, usually improves the solder wetting but can negatively affect the process yield because the solder members may be able to "float" up and off the conductive pads and/or create electrical bridges (shorts) with neighboring interconnections comprising the BGA.

Typically, tin-lead solders exhibit robust wetting in air reflow ovens, however the wetting of lead-free solders is negatively impacted especially by the presence of oxygen during reflow. Substitution of nitrogen for air in the lead-free reflow process can be very expensive and cumbersome.

As a result, there exists in the industry a need for a more reliable, less costly method of making an interconnection between a solder member, particularly a lead-free solder member, and a conductive pad of a substrate to make a circuitized substrate which overcomes the disadvantages of the known method and structure.

SUMMARY OF THE INVENTION

Accordingly, it is an object of this invention to enhance the art of electronic packaging.

Another object of the present invention is to provide a circuitized substrate for use in the manufacture of an electronic package including a substrate having a conductive pad thereon, a first layer of solder enhancing material positioned on the conductive pad, a solder member positioned on a portion of the first layer of solder enhancing material, and a second layer of solder enhancing material positioned on the solder member and on exposed portions of the first layer of solder enhancing material.

Yet another object of the present invention is to provide a method of making a circuitized substrate having a substrate with a conductive pad thereon, a first layer of solder enhancing material positioned on the conductive pad, a solder member positioned on a portion of the first layer of solder enhancing material, and a second layer of solder enhancing material positioned on the solder member and on exposed portions of the first layer of solder enhancing material.

Another object is to provide such a circuitized substrate and method that are both adaptable to mass production, thus assuring lower costs.

According to one aspect of the invention there is provided a circuitized substrate comprising a substrate having at least one conductive pad thereon, a first layer of solder enhancing material positioned on the at least one conductive pad, the first layer of solder enhancing material including a first region and a second region positioned relative to the first region, a solder member positioned on the first region of the first layer of solder enhancing material, and a second layer of solder enhancing material positioned on the solder member and on a portion of the second region of the first layer of solder enhancing material.

According to another aspect of the invention there is provided a circuitized substrate comprising a substrate having at least one conductive pad thereon, the at least one conductive pad including a first portion and a second portion positioned adjacent the first portion, a first layer of solder enhancing material positioned on the first portion of the at least one conductive pad, the first layer of solder enhancing material including a first region and a second region positioned relative to the first region, a solder member positioned on the first region of the first layer of solder enhancing material, and a second layer of solder enhancing material positioned on the solder member, on the second region of the first layer of solder enhancing material, and on the second portion of the at least one conductive pad.

According to yet another aspect of the invention there is provided a method for making a circuitized substrate comprising the steps of providing a substrate having at least one conductive pad thereon, applying a first layer of solder enhancing material on the at least one conductive pad, the first layer of solder enhancing material including a first region and a second region positioned relative to the first region, positioning a solder member on the first region of the first layer of solder enhancing material, and applying a second layer of solder enhancing material on the solder member and on a portion of the second region of the first layer of solder enhancing material.

According to still yet another aspect of the invention there is provided a method for making a circuitized substrate comprising the steps of providing a substrate having at least one conductive pad thereon, the at least one conductive pad including a first portion and a second portion positioned adjacent to the first portion, applying a first layer of solder enhancing material on the first portion of the at least one conductive pad, the first layer of solder enhancing material including a first region and a second region positioned relative to the first region, positioning a solder member on the first region of the first layer of solder enhancing material, and applying a second layer of solder enhancing material on the solder member, on the second region of the first layer of solder enhancing material, and on the second portion of the at least one conductive pad.

The above objects, advantages, and features of the present invention will become more readily apparent from the following detailed description of the preferred embodiments as illustrated in the accompanying drawings.

DETAILED DESCRIPTION OF THE INVENTION

Figure 1:
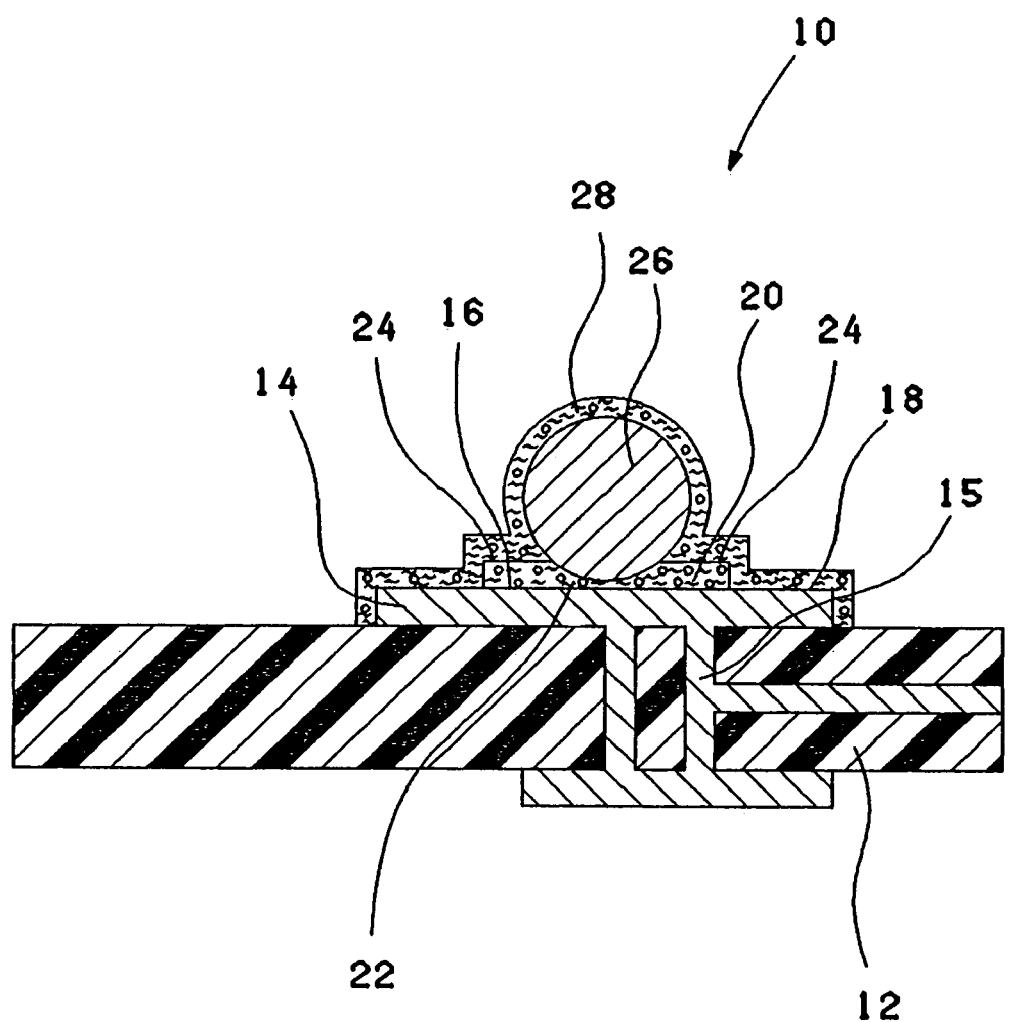
FIG. 1 is a much enlarged partial sectional view, in elevation, of one embodiment of the circuitized substrate of the present invention illustrating a substrate having a conductive pad thereon, a first layer of solder enhancing material positioned on a portion of the conductive pad, a solder member positioned on a portion of the first layer of solder enhancing material, and a second layer of solder enhancing material positioned on the solder member, on the exposed portion of the first layer of solder enhancing material, and on the conductive pad.

A circuitized substrate 10 illustrating one embodiment of the present invention is shown in FIG. 1. The circuitized substrate includes a substrate 12 having a conductive pad 14 thereon. Conductive pad 14 has a first portion 16 and a second portion 18 positioned adjacent to the first portion. A first layer of solder enhancing material 20 is positioned on first portion 16 of conductive pad 14. First layer of solder enhancing material 20 includes a first region 22 and a second region 24 positioned relative to the first region. A solder member 26 is positioned on first region 22 of first layer of solder enhancing material 20. A second layer of solder enhancing material 28 is positioned on solder member 26, on second region 24 of first layer of solder enhancing material 20, and on second portion 18 of conductive pad 14.

Substrate 12 can comprise a chip carrier or any suitable substrate on which a solder member is to be positioned for electrical interconnection purposes. Suitable substrates that can be used in this invention may be comprised of epoxy resins filled with glass, ceramics, and silicon. Conductive pad 14 can be electrically connected to conductive through apertures 15 within substrate 12 to make electrical connections to other electronic devices.

First layer of solder enhancing material 20 and second layer of solder enhancing material 28 can both be comprised of organic or inorganic acids in a solvent system. Examples of acids suitable for use in this invention are amine hydrochlorides and carboxylic acids. Suitable commercially available solder enhancing materials are Alpha WS600 from Alpha Metals, 600 Route 440, Jersey City, N.Y., and Kester SE-CURE 9750 from Kester Solder, 515 East Toucy Ave., Des Plaines, Ill. Examples of suitable solvents are water, alcohols and glycols. Examples of glycols that can be used as solvents in this invention are polyalkyl glycol, hexylene glycol, and diethylene glycol. The solder enhancing materials may include surfactants and thickeners to improve its performance. First layer of solder enhancing material 20 includes a thickness of from about 0.0002 inches to about 0.005 inches. This thickness is important because if first layer of solder enhancing material 20 is too thin there may not enough material to hold solder member 26 in place and there may not be enough active ingredients present to ensure good wetting of the solder member on conductive pad 14 during heat-up and reflow. If first layer of solder enhancing material 20 is too thick the solder member may be easily displaced from its desired location during processing.

Solder member 26 preferably comprises a lead-free solder and is selected from the group of metals consisting of tin, silver, copper, antimony, bismuth, indium, zinc, and alloys thereof. For example, one solder which can be used in this invention is a lead-free solder having about 3.8 wt. % silver, about 0.7 wt. % to about 0.9 wt. % copper, with the remainder tin. Solder member 26 can be substantially in the shape of a sphere, cylinder, or rectangle. First layer of solder enhancing material 20 includes adhesive properties so that solder member 26 can be substantially held in place on conductive pad 14 by first region 22 of the first layer of solder enhancing material. First region 22 of first layer of solder enhancing material 20 is defined by the contact area substantially under solder member 26 and is dependent on the size and shape of the solder member. The second layer of solder enhancing material 28 includes a thickness of less than about 0.001 inches.

In the absence of solder enhancing material, a lead-free solder member positioned on a conductive pad, such as copper, when reflowed in an environment including oxygen, for example in air, will have a tendency to not completely wet the conductive pad. Positioning lead-free solder member 26 on conductive pad 14 with only a first layer of solder enhancing material 20 is not sufficient to result in complete wetting of the conductive pad in a reflow environment including oxygen. Substituting a nitrogen rich, essentially oxygen free, environment would result in complete wetting of the lead-free solder member to conductive pad 14, however, this requires substantial expense and specialized reflow ovens. This is impractical and very costly in a large scale manufacturing environment. Significantly, second layer of solder enhancing material 28 in combination with first layer of solder enhancing material 20, as taught in this invention, eliminates the need for use of a costly nitrogen rich, substantially oxygen free reflow environment and leads to substantially complete wetting of conductive pad 14 by solder member 26 during reflow of the solder member. The second layer of solder enhancing material 28 enhances wetting in many ways. Since it is positioned on solder member 26 and second portion 18 of conductive pad 14 it can react with the oxygen present in the reflow environment during reflow to prevent oxygen from oxidizing solder member 26 and second portion 18 of conductive pad 14. Second layer of solder enhancing material 28 also provides a physical barrier between environmental oxygen, solder member 26 and conductive pad 14 preventing oxidation. Furthermore, first and second layers of solder enhancing materials 20 and 28, respectively, can react with native oxides on solder member 26 and conductive pad 14 to consume these oxides and results in substantially complete wetting of the conductive pad by the solder member during reflow.

Figure 2:
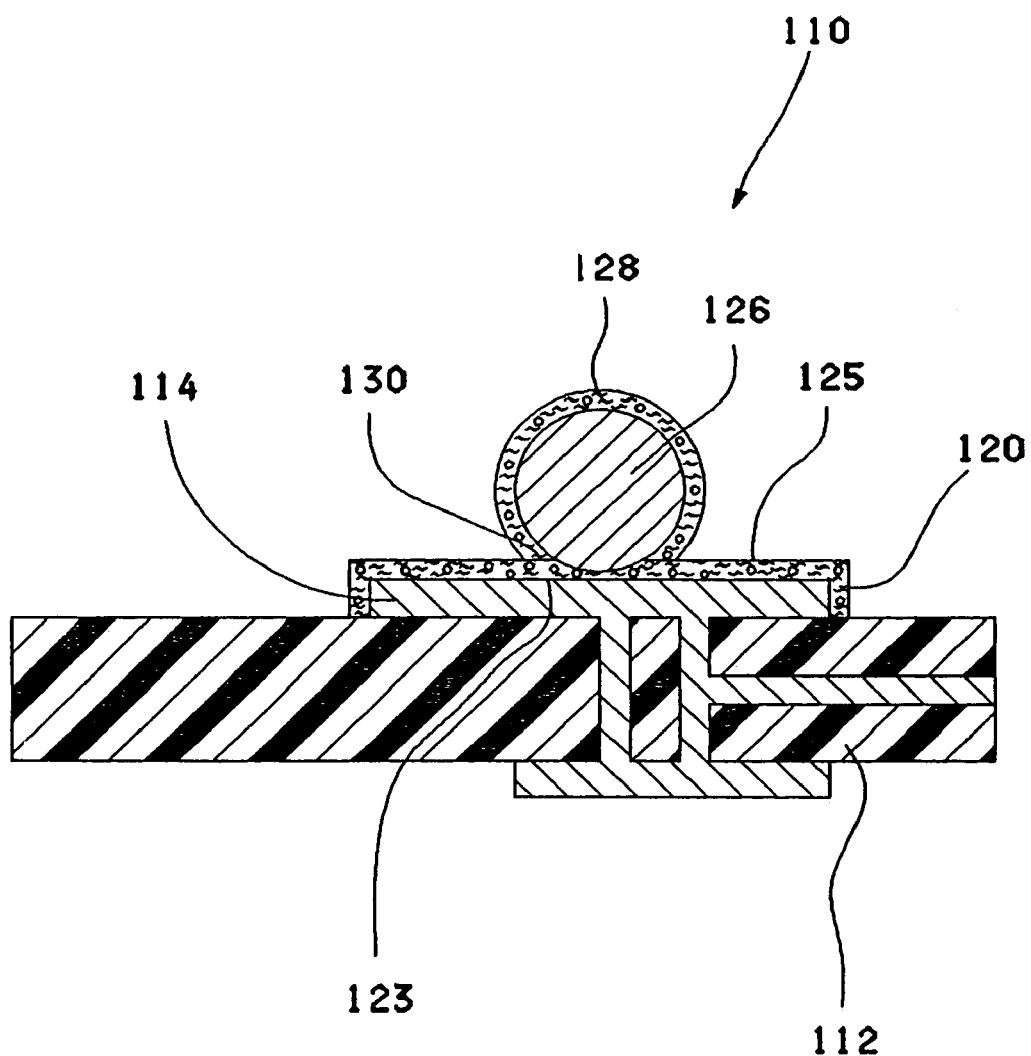
FIG. 2 is a much enlarged partial sectional view, in elevation of another embodiment of the circuitized substrate of the present invention, illustrating a substrate having a conductive pad thereon, a first layer of solder enhancing material positioned on the conductive pad, a solder member positioned on a portion of the first layer of solder enhancing material, and a second layer of solder enhancing material positioned on the solder member and a portion of the first layer of solder enhancing material.

FIG. 2 illustrates another embodiment of a circuitized substrate 110 of the present invention where solder member 126 can substantially wet conductive pad 114 during reflow of the solder member. Circuitized substrate 110 includes a substrate 112 having at least one conductive pad 114 thereon. A first layer of solder enhancing material 120 includes a first region 123 and a second region 125, positioned relative to the first region. Solder member 126 is positioned on first region 123 of first layer of solder enhancing material 120. A second layer of solder enhancing material 128 is positioned on solder member 126 and on a portion 130 of second region 125 of first layer of solder enhancing material 120.

Figure 3:
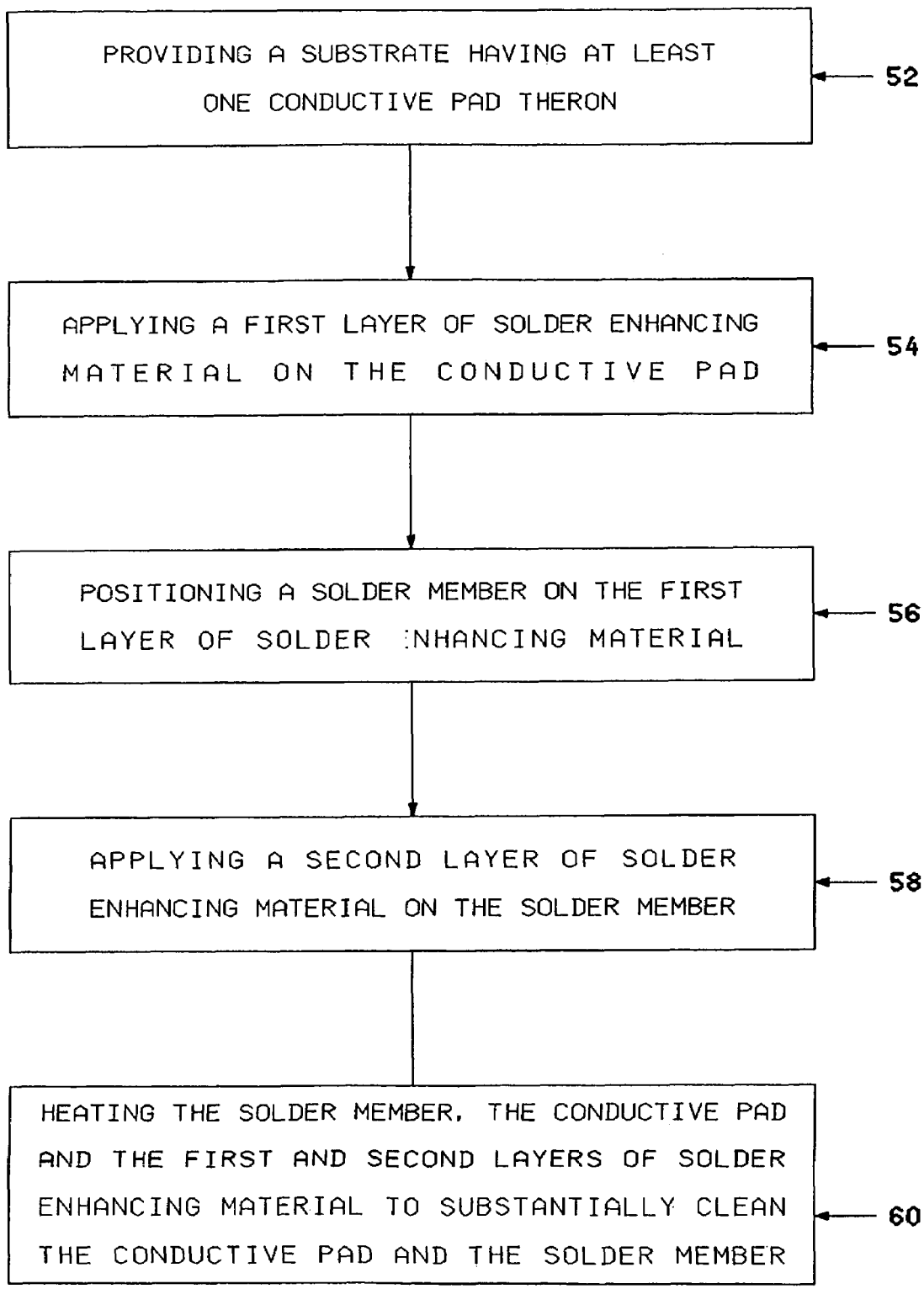
FIG. 3 is a process flow diagram showing the method of making the circuitized substrate according to the present invention.

Referring to FIG. 3, a method 50 of making a circuitized substrate is shown. The first step 52 in this method is providing a substrate having at least one conductive pad thereon, the conductive pad including a first portion and a second portion positioned adjacent to the first portion. The substrate has been previously described in detail above.

Step 54 includes applying a first layer of solder enhancing material on the conductive pad, the first layer of solder enhancing material including a first region and a second region. The first layer of solder enhancing material may be applied by pin transferring, dipping, stenciling, or screening on only the first portion of the conductive pad, or on the first and second portions of the conductive pad to substantially cover the conductive pad. Pin transfer or screening allows for a uniform thickness of solder enhancing material to be deposited on the conductive pad. The quantity of solder enhancing material used directly influences the amount of coverage and robustness of wetting of a solder member on the conductive pad during reflow. By controlling the area of the conductive pad and the amount of solder enhancing material used, final coverage is controlled. Applying the thickness of first layer of solder enhancing material, as described above, between about 0.0002 inches and about 0.005 inches will assist in complete wetting of the conductive pad on which the solder member is to be positioned. Increasing the thickness of first layer of solder enhancing material above about 0.005 inches can cause the solder member to float or move during processing and can lead to bridging of solder between adjacent conductive pads. This can cause electrical shorts. The first layer of solder enhancing material can be an organic or inorganic acid in a solvent system, as described above.

Step 56 includes positioning a solder member on the first region of the first layer of solder enhancing material. The solder member is described in detail above. The solder member can be held in place by a template. The solder enhancing material is tacky and tends to hold the solder member in place and the first layer of solder enhancing material is thin enough so that surface tension can provide resistance to movement of the solder member during processing.

Step 58 includes applying a second layer of solder enhancing material on the solder member. This step can further include applying a second layer of solder enhancing material on a portion of or on all of the second region of the first layer of solder enhancing material, if additional material is desired. This will depend on the lead-free solder alloy to be used. The second layer of solder enhancing material can also be applied to the second portion of the conductive pad if additional flux is required with the lead-free solder being used. Applying the second layer of solder enhancing material comprises spraying. Spraying is accomplished at a temperature of from about 68 degrees Fahrenheit (° F.) to about 73° F., at a pressure of from about 10 pounds per square inch (psi) to about 500 psi for less than about a minute. It is important to control the amount of the second layer of solder enhancing material applied to the solder member to give the desired thickness in a substantially uniform manner and not to dislodge the solder member. This can best be accomplished by spraying the second layer of solder enhancing material onto the solder member. A dipping or screening process, if used to apply the second layer of solder enhancing material, will not yield these advantages. The second layer of solder enhancing material can be an organic or inorganic acid in a solvent system, as described above, but is not limited to the same acid or solvent system as the first layer of solder enhancing material.

Step 60 includes heating the solder member, the conductive pad, and the first and second layers of solder enhancing material to substantially clean the conductive pad and the solder member with the first and second layers of solder enhancing material. Heating is performed at a temperature of from about 70° C. to about 260° C. for a time of from about 7 minutes to about 15 minutes. Heating also melts and reflows the solder member and upon cooling bonds the solder member electrically and mechanically to the conductive pad to form an interconnection. Flux residues can remain on the surface of the substrate or can be removed with a solvent by spraying or immersion of the substrate in the solvent. The circuitized substrate is now ready for further assembly.

What has been shown and described are at present considered the preferred embodiments of this invention, it will be obvious to those skilled in the art that various changes and modifications can be made therein without departing from the scope of the invention as defined by the appended claims.

What is claimed is:

1. A method of making a circuitized substrate comprising the steps of:

providing a substrate having at least one conductive pad thereon;

applying a first layer of solder enhancing material on said at least one conductive pad, said first layer of solder enhancing material including a first region and a second region positioned relative to said first region;

positioning a solder member on said first region of said first layer of solder enhancing material; and applying a second layer of solder enhancing material on said solder member and on a portion of said second region of said first layer of solder enhancing material, and wherein said step of applying said first layer of solder enhancing material comprises pin transferring, dipping, stenciling, or screening.

2. The method of making the circuitized substrate of claim 1 wherein said step of applying said second layer of solder enhancing material comprises spraying.

3. The method of making the circuitized substrate of claim 1 wherein said spraying is performed at a temperature of from about 68° F. to about 73° F., at a pressure of from about 10 psi to about 500 psi for less than about one minute.

4. The method of making the circuitized substrate of claim 1 further including the step of heating said solder member, said at least one conductive pad, and said first and second layers of solder enhancing material to substantially clean said at least one conductive pad and said solder member with said first and second layers of solder enhancing material, and wherein said heating step is performed at a temperature of from about 70° C. to about 260° C.

5. The method of claim 4 where said heating step is performed for a time of from about 7 minutes to about 15 minutes.

6. A method of making a circuitized substrate comprising the steps of:
    providing a substrate having at least one conductive pad thereon, said at least one conductive pad including a first portion and a second portion positioned adjacent said first portion;
    applying a first layer of solder enhancing material on said first portion of said at least one conductive pad, said first layer of solder enhancing material including a first region and a second region positioned relative to said first region;
    positioning a solder member on said first region of said first layer of solder enhancing material; and
    applying a second layer of solder enhancing material on said solder member, on said second region of said first layer of solder enhancing material, and on said second portion of said at least one conductive pad, and wherein said step of applying said first layer of solder enhancing material comprises pin transferring, dipping, stenciling, or screening.

7. The method of making the circuitized substrate of claim 6 wherein said step of applying said second layer of said solder enhancing material comprises spraying.

8. The method of making the circuitized substrate of claim 7 wherein said spraying is performed at a temperature of from about 63° F. to about 73° F., at a pressure of from about 10 psi to about 500 psi for less than about one minute.

9. The method of making the circuitized substrate of claim 6 further including the step of heating said solder member, said at least one conductive pad, and said first and second layers of solder enhancing material to substantially clean said at least one conductive pad and said solder member with said first and second layers of solder enhancing material, and wherein said heating step is performed at a temperature of from about 70° C. to about 260° C.

10. The method of claim 9 where said heating step is performed for a time of from about 7 minutes to about 15 minutes.

11. A method of making a circuitized substrate comprising the steps of:
    providing a substrate having at least one conductive pad thereon;
    applying a first layer of solder enhancing material on said at least one conductive pad, said first layer of solder enhancing material including a first region and a second region positioned relative to said first region;
    positioning a solder member on said first region of said first layer of solder enhancing material; and
    applying a second layer of solder enhancing material on said solder member and on a portion of said second region of said first layer of solder enhancing material, and wherein said first and second layers of solder enhancing material each comprise a solution consisting essentially of amine hydrochlorides and carboxylic acids in a solvent system.

12. A method of making a circuitized substrate comprising the steps of:
    providing a substrate having at least one conductive pad thereon, said at least one conductive pad including a first portion and a second portion positioned adjacent said first portion;
    applying a first layer of solder enhancing material on said first portion of said at least one conductive pad, said first layer of solder enhancing material including a first region and a second region positioned relative to said first region;
    positioning a solder member on said first region of said first layer of solder enhancing material; and
    applying a second layer of solder enhancing material on said solder member, on said second region of said first layer of solder enhancing material, and on said second portion of said at least one conductive pad, and wherein said first and second layers of solder enhancing material each comprise a solution consisting essentially of amine hydrochlorides and carboxylic acids in a solvent system.

13. A method of making a circuitized substrate comprising the steps of:
    providing a substrate having at least one conductive pad thereon, said at least one conductive pad including a first portion and a second portion positioned adjacent said first portion;
    applying a first layer of solder enhancing material on said first portion of said at least one conductive pad, said first layer of solder enhancing material including a first region and a second region positioned relative to said first region;
    positioning a solder member on said first region of said first layer of solder enhancing material; and
    applying a second layer of solder enhancing material on said solder member, on said second region of said first layer of solder enhancing material, and on said second portion of said at least one conductive pad, and wherein said first layer of solder enhancing material includes a thickness of from about 0.0002 inches to about 0.005 inches.

14. A method of making a circuitized substrate comprising the steps of:
    providing a substrate having at least one conductive pad thereon, said at least one conductive pad including a first portion and a second portion positioned adjacent said first portion;
    applying a first layer of solder enhancing material on said first portion of said at least one conductive pad, said first layer of solder enhancing material including a first region and a second region positioned relative to said first region;
    positioning a solder member on said first region of said first layer of solder enhancing material; and
    applying a second layer of solder enhancing material on said solder member, on said second region of said first layer of solder enhancing material, and on said second portion of said at least one conductive pad, and wherein said first layer of solder enhancing material includes a thickness of from about 0.0002 inches to about 0.005 inches.

* * * * *

UNITED STATES PATENT AND TRADEMARK OFFICE
CERTIFICATE OF CORRECTION

| | | |
|---|---|---|
| PATENT NO. | : 7,037,819 B2 | |
| APPLICATION NO. | : 10/967035 | |
| DATED | : May 2, 2006 | |
| INVENTOR(S) | : Gosselin et al. | |

It is certified that error appears in the above-identified patent and that said Letters Patent is hereby corrected as shown below:

Please amend FIG. 3 number 56 to read as follows:

POSITIONING A SOLDER MEMBER ON THE FIRST LAYER OF SOLDER ENHANCING MATERIAL

Column 7, line 5, change "1" to --2--.

Signed and Sealed this

Twenty-second Day of August, 2006

JON W. DUDAS
*Director of the United States Patent and Trademark Office*